United States Patent
Kim et al.

(10) Patent No.: US 11,610,101 B2
(45) Date of Patent: Mar. 21, 2023

(54) FORMATION FAILURE RESILIENT NEUROMORPHIC DEVICE

(71) Applicant: International Business Machines Corporation, Armonk, NY (US)

(72) Inventors: Youngseok Kim, Upper Saddle River, NJ (US); Jungwook Choi, Seoul (KR); Seyoung Kim, White Plains, NY (US); Chun-Chen Yeh, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 836 days.

(21) Appl. No.: 16/557,110

(22) Filed: Aug. 30, 2019

(65) Prior Publication Data

US 2021/0064974 A1    Mar. 4, 2021

(51) Int. Cl.
| G06N 3/063 | (2006.01) |
| G06F 17/18 | (2006.01) |
| G06F 7/58 | (2006.01) |
| G06N 3/082 | (2023.01) |

(52) U.S. Cl.
CPC ............ *G06N 3/063* (2013.01); *G06F 7/588* (2013.01); *G06F 17/18* (2013.01); *G06N 3/082* (2013.01)

(58) Field of Classification Search
CPC .... G06N 3/063; G06N 3/0635; G06N 3/0454; G06N 3/08; G06N 3/082; G06N 3/084; G06F 7/588; G06F 17/18; G11C 2013/0045; G11C 2013/0071; G11C 13/004; G11C 2013/0073; G11C 2213/74; G11C 13/003; G11C 2213/79; G11C 11/54; G11C 13/0002
See application file for complete search history.

(56) References Cited

U.S. PATENT DOCUMENTS

| 8,045,361 | B2 | 10/2011 | Lee et al. | |
| 8,064,248 | B2 | 11/2011 | Lung | |
| 9,847,129 | B2 | 12/2017 | Buchanan | |
| 9,992,057 | B2 | 6/2018 | Rivera et al. | |
| 2018/0075350 | A1* | 3/2018 | Gokmen | G06N 3/08 |
| 2018/0089559 | A1* | 3/2018 | Copel | G06N 3/04 |
| 2018/0114572 | A1* | 4/2018 | Gokmen | G11C 13/0038 |
| 2018/0197917 | A1 | 7/2018 | Ando et al. | |
| 2018/0253642 | A1* | 9/2018 | Gokmen | G06N 3/0635 |
| 2019/0065937 | A1 | 2/2019 | Nowatzyk et al. | |
| 2019/0073259 | A1* | 3/2019 | Qin | G06N 3/02 |
| 2019/0156183 | A1* | 5/2019 | Durham | G06N 3/0472 |

(Continued)

OTHER PUBLICATIONS

Luo, "An FPGA-Based Hardware Emulator for Neuromorphic Chip With RRAM", 2018, IEEE, pp. 438-450. (Year: 2018).*

(Continued)

*Primary Examiner* — Kenneth Tang
(74) *Attorney, Agent, or Firm* — Daniel Yeates; Ryan, Mason & Lewis, LLP

(57) ABSTRACT

A neuromorphic device includes a plurality of first control lines, a plurality of second control lines and a matrix of resistive processing unit cells. Each resistive processing unit cell is electrically connected with one of the first control lines and one of the second control lines. A given resistive processing unit cell includes a first resistive device and a second resistive device. The first resistive device is a positively weighted resistive device and the second resistive device is a negatively weighted resistive device.

20 Claims, 9 Drawing Sheets

(56) References Cited

U.S. PATENT DOCUMENTS

| | | | | |
|---|---|---|---|---|
| 2019/0164044 A1* | 5/2019 | Song | ............... | G11C 16/0408 |
| 2020/0035305 A1* | 1/2020 | Choi | ............... | G11C 11/54 |
| 2021/0256362 A1* | 8/2021 | Lie | ............... | G06N 3/084 |
| 2021/0342678 A1* | 11/2021 | Mostafa | ............... | G06N 3/0635 |
| 2022/0043356 A1* | 2/2022 | Zhang | ............... | G03F 7/705 |

OTHER PUBLICATIONS

T. Gokmen et al., "Acceleration of Deep Neural Network Training with Resistive Cross-Point Devices: Design Considerations," Frontiers in Neuroscience, Jul. 21, 2016, pp. 1-13, vol. 10, Article 333.

M. Bocquet et al., "In-Memory and Error-Immune Differential RRAM Implementation of Binarized Deep Neural Networks," IEEE International Electron Devices Meeting (IEDM), Dec. 2018, 4 pages.

A. Neelakantan et al., "Adding Gradient Noise improves Learning for Very Deep Networks," ArXiv preprint arXiv: 1511.06807, Nov. 21, 2015, 11 pages.

R. Kaplan et al., "PRINS: Processing-in-Storage Acceleration of Machine Learning," IEEE Transactions on Nanotechnology, Sep. 2018, pp. 889-896, vol. 17, No. 5.

* cited by examiner

100

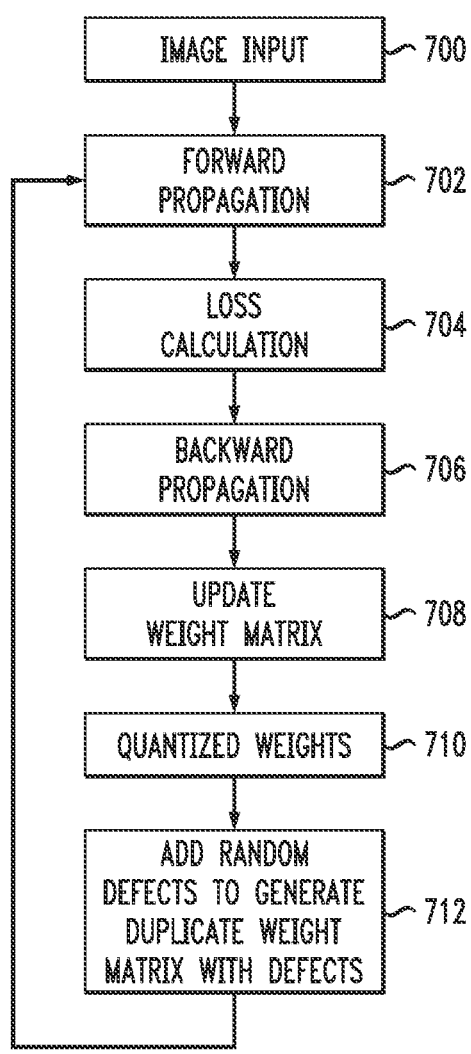

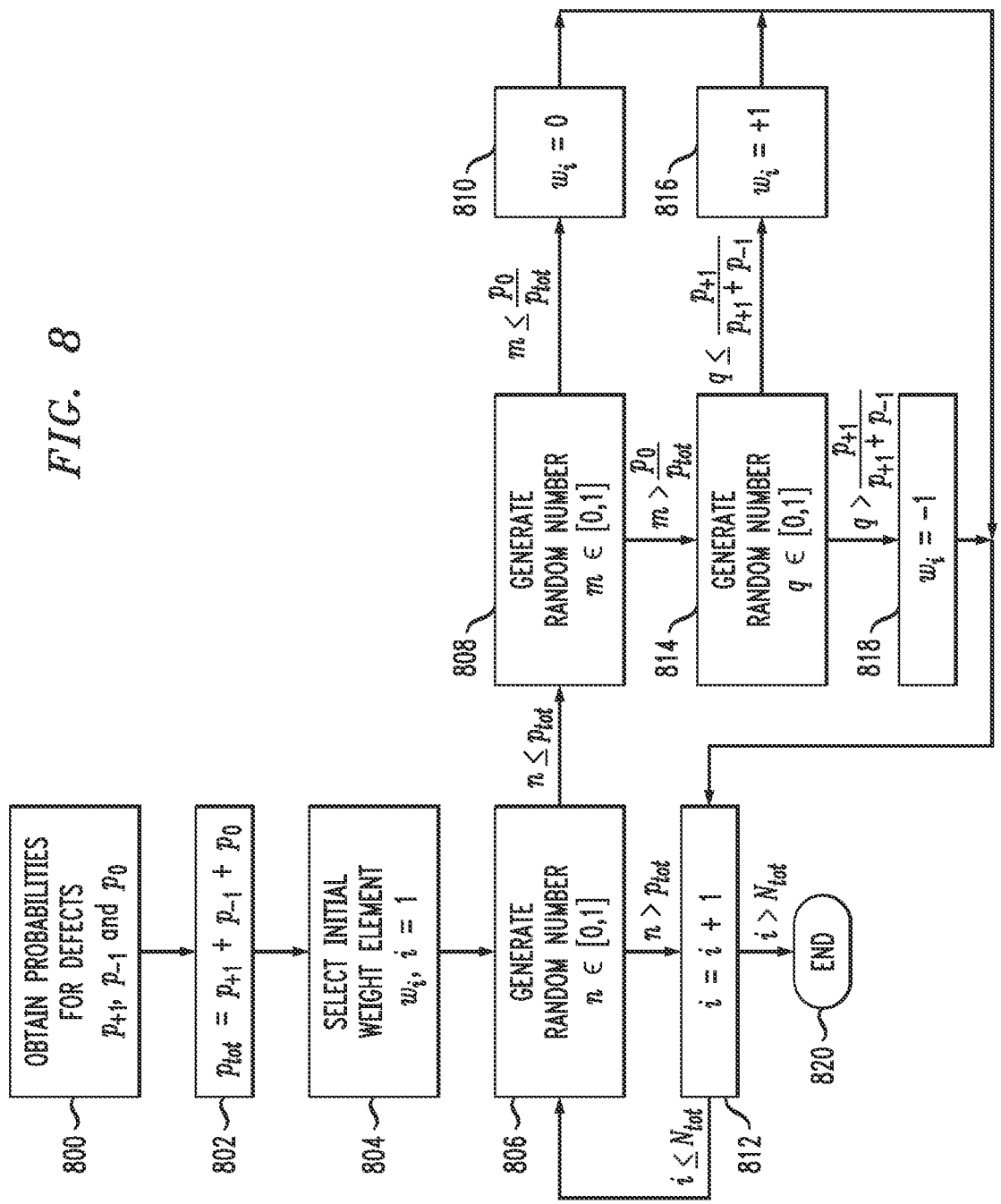

FORMATION FAILURE RESILIENT NEUROMORPHIC DEVICE

BACKGROUND

In recent years, deep neural network (DNN) based models have made significant progress due to the availability of large labeled datasets and continuous improvements in computation resources. DNNs are utilized in various applications including, for example, object/speech recognition, language translation, pattern extraction, and image processing. The quality of the DNN models depends on the processing of a large amount of training data and an increased complexity of the neural network. In this regard, training a complex DNN model is a time consuming and computationally intensive task which can require many days or weeks to perform using parallel and distributed computing frameworks with many computing nodes (e.g., datacenter-scale computational resources) to complete the training of the DNN model.

To reduce training time, hardware acceleration techniques for processing DNN workloads have been pursued either in conventional CMOS technologies or by using emerging non-volatile memory (NVM) technologies. However, it has been found that neuromorphic device architectures comprising resistive processing unit (RPU) cells have the potential to accelerate DNN training by orders of magnitude, while using less power, as compared to conventional hardware acceleration techniques. DNN training generally relies on a backpropagation algorithm which includes three repeating cycles: forward, backward and weight update. It has been determined that neuromorphic devices which are based on a two-dimensional (2D) crossbar array of RPU cells can be configured to perform all three cycles of the backpropagation algorithm in parallel, thus potentially providing significant acceleration in DNN training with lower power and reduced computation resources compared to state-of-the-art implementations using central processing units (CPUs) and graphics processing units (GPUs).

SUMMARY

A neuromorphic device according to an exemplary embodiment includes a plurality of first control lines, a plurality of second control lines and a matrix of resistive processing unit cells. Each resistive processing unit cell is electrically connected with one of the first control lines and one of the second control lines. A given resistive processing unit cell includes a first resistive device and a second resistive device. The first resistive device is a positively weighted resistive device and the second resistive device is a negatively weighted resistive device.

A method according to an exemplary embodiment includes training an inference model. The training includes obtaining a probability for a type of defect associated with a forming failure of a resistive device of a neuromorphic device and for a given weight in the inference model: generating a random number, determining based at least in part on the generated random number and the obtained probability for the type of defect that the type of defect should be added to the given weight and adding the type of defect to the given weight.

A method according to an exemplary embodiment includes executing a trained inference model on a neuromorphic device. The neuromorphic device includes a plurality of resistive processing units each comprising at least one resistive device. The trained inference model comprising a plurality of weights. Each weight corresponds to one of the resistive processing units. The weights of the trained inference model include randomly generated defects corresponding to potential formation failures of the resistive devices of the resistive processing units.

These and other exemplary embodiments will be described in or become apparent from the following detailed description of exemplary embodiments, which is to be read in connection with the accompanying drawings.

BRIEF DESCRIPTION OF THE DRAWINGS

Exemplary embodiments will be described below in more detail, with reference to the accompanying drawings, of which:

FIG. 7 is a flow chart of a process for training an inference model, according to an embodiment of the invention.

FIG. 8 is a flow chart of a process for adding defects to the weights of an inference model, according to an embodiment of the invention.

DETAILED DESCRIPTION

Exemplary embodiments of the invention will now be discussed in further detail with regard to initialization failure resilient neuromorphic devices.

RPU cells change their states in response to the application of electrical energy. For example, RPU cells may be implemented with resistive random-access memory (RRAM), phase change memory (PCM), programmable metallization cell (PMC) memory, non-linear mem-resistive systems, or any other device that has resistive switching characteristics.

RRAM is often initialized during an initialization process, also known as a forming process. In some cases, the forming process for an RRAM device may fail, resulting in a forming failed (FF) device or an over formed (OF) device. An FF device typically has a value of 0 while an OF device typically has a value of either +1 or −1. In some neuromorphic architectures, such RRAM device initialization failures cannot be rerouted. Minimizing the impact of such RRAM initialization failures on the accuracy of DNN operations running on such a neuromorphic device architecture can present challenges.

Figure 1:
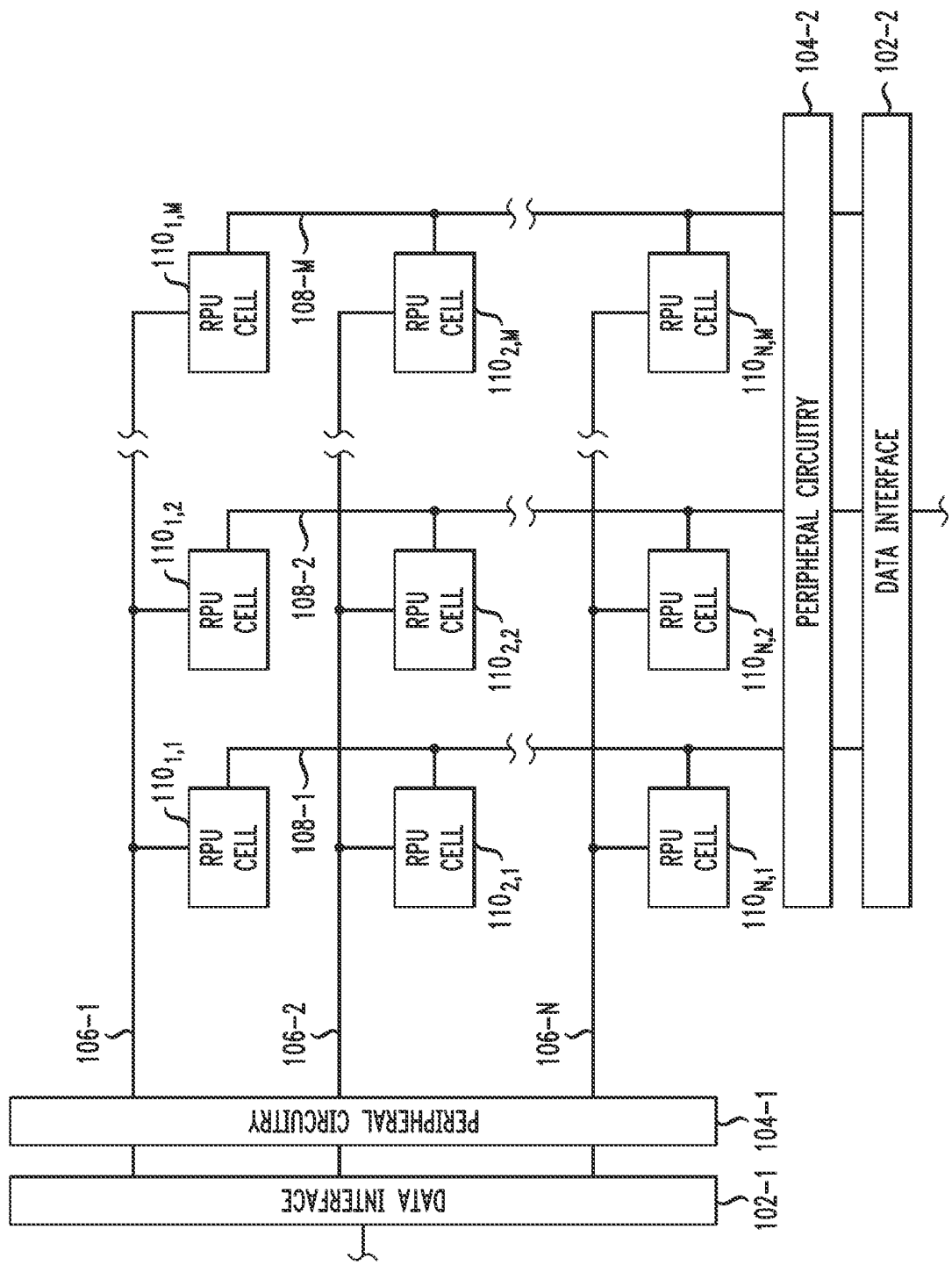
FIG. 1 is a schematic diagram illustrating an example neuromorphic device architecture, according to an embodiment of the invention.

One example neuromorphic device architecture that may be utilized for performing machine learning operations is shown in FIG. 1. With reference to FIG. 1, an example neuromorphic device architecture 100 comprises data interfaces 102-1 and 102-2, peripheral circuits 104-1 and 104-2, row control lines 106-1, 106-2 . . . 106-N and column control lines 108-1, 108-2 . . . 108-M. A matrix of RPU cells $110_{1,1}$, $110_{1,2}$ . . . $110_{1,M}$, $110_{2,1}$, $110_{2,2}$ . . . $110_{2,M}$, . . . $110_{N,1}$, $110_{N,2}$ . . . $110_{N,M}$ is connected to the row control lines 106 and column control lines 108 where each RPU cell is connected to one of the row control lines 106 and one of the column control lines 108. For example, RPU cell $110_{1,1}$ is connected to row control line 106-1 and column control line 108-1. Such an example architecture is sometimes referred to as a 2D cross-bar array. In some embodiments, neuromorphic device architecture 100 may also comprise reference circuitry (not shown) which comprises various types of circuit blocks such as power, clock, bias and timing circuitry to provide power distribution, control signals and clocking signals for operation of the neuromorphic device architecture 100.

In some embodiments, the neuromorphic device architecture 100 is configured to perform DNN computations wherein a conductance of each RPU cell 110 represents a matrix element or weight, which can be updated or accessed through operations of the peripheral circuits 104. As noted above, DNN training generally relies on a backpropagation process which comprises three repeating cycles: a forward cycle, a backward cycle, and a weight update cycle. The neuromorphic device architecture 100 can be configured to perform all three cycles of the backpropagation process in parallel, thus potentially providing significant acceleration in DNN training with lower power and reduced computation resources. The neuromorphic device architecture 100 can be configured to perform vector-matrix multiplication operations in the analog domain in a parallel manner, which leads to a significant enhancement in performance (e.g., 10K times or more) as compared to a counterpart CPU/GPU implementation.

While the row control lines 106 and column control lines 108 are each shown in FIG. 1 as a single line for ease of illustration, it is to be understood that the row and column control lines can include two or more control lines connected to the RPU cells 110 in the respective rows and columns, depending on the implementation. For example, in one embodiment, each row control line 106 and each column control line 108 comprises a pair of control lines, including an "Update" control line, and a "Read" control line, wherein the cell conductance (e.g., weight value) of a given RPU cell 110 can be adjusted and sensed through the Update and Read control lines, respectively, for a given row and column connected to the given RPU cell 110.

In some embodiments, each of peripheral circuits 104 comprises essentially the same set of circuitries connected to the respective rows and columns in the 2D array of RPU cells 110 to perform forward, backward and update operations for a backpropagation process. For example, in one embodiment, to support an RPU cell update operation (e.g., update weight value of given RPU cell 110), each of the peripheral circuits 104 comprises a stochastic pulse generator block and an update pulse driver block, which are responsive to update vectors that are received during a weight update cycle, to generate and apply a series of stochastically populated pulses to control circuitry within a given RPU cell 110 to update the weight value of the given RPU cell 110. The stochastic pulses are transmitted on the row or column control lines to control circuitry within the given RPU cell 110 to perform various operations (e.g., multiplication) to update a stored weight value within the RPU cell 110 using known techniques. While a single peripheral circuit is illustrated for each respective data interface, in some embodiments, a plurality of peripheral circuits may be included for each respective data interface. For example, each control line may be connected to a separate peripheral circuit that is used to communicate with the corresponding data interface.

In addition, in one embodiment, to support an RPU cell read and sensing operations (e.g., read a weight value of given RPU cell 110), each of peripheral circuits 104 comprises (i) a pulse-width modulation (PWM) circuit and read pulse driver circuit to generate and apply PWM read pulses to the RPU cells 110, in response to input vector values (read input values) received during forward/backward cycles, and (ii) a current integrator circuit and analog-to-digital (ADC) circuit to integrate read current that is output and accumulated from the connected RPU cells 110 and convert the integrated current into a digital value (read output value) for subsequent computation.

The data interfaces 102 are configured to (i) receive external control signals and apply update and read input values to the peripheral circuits 104, and (ii) receive digital read output values from the peripheral circuits 104, and send the digital read output signals to a remote element for processing.

Each RPU cell 110 in the neuromorphic device architecture 100 comprises a resistor-like circuit component with a tunable conductance, wherein the conductance value of each RPU cell 110 represents a matrix element or weight. For example, in some embodiments, the RPU cells 110 can be implemented using variable resistance devices such as resistive memory elements used in RRAM systems. In other embodiments, the RPU cells 110 can be implemented using an analog CMOS framework comprising a capacitor and one or more read transistors, wherein the capacitor serves as a memory element in the RPU cell which stores a weight value in the form of capacitor voltage. The capacitor voltage is directly applied to the gate terminal(s) of the read transistor(s) to modulate the channel resistance of the read transistor(s). The charge state stored in the capacitor can be accessed by applying a small bias across the read transistor(s) to generate drain currents, which generate a read current that flows out of RPU cell.

Figure 2:
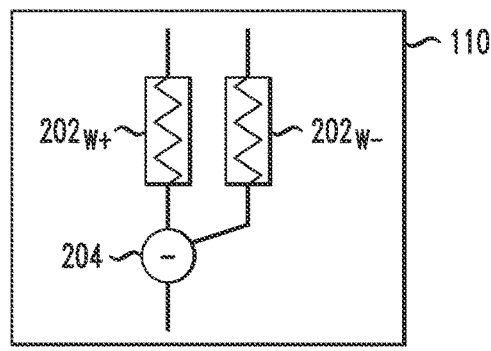
FIG. 2 is a schematic diagram illustrating an example RPU cell of the neuromorphic device architecture of FIG. 1, according to an embodiment of the invention.

With reference now to FIG. 2, an example RPU cell 110 according to an illustrative embodiment is illustrated. As seen in FIG. 2, the example RPU cell 110 comprises a pair of resistive devices $202_{w+}$ and $202_{w-}$, e.g., RRAM devices, which respectively represent the positive and negative weights for the example RPU cell 110. For example, the current flowing through resistive device $202w-$ is subtracted from the current flowing through resistive device $202w+$ in the peripheral circuitry 104 (as denoted by the minus sign 204) to implement the positive and negative weights represented by the resistive devices $202w+$ and $202w-$. The inclusion of a pair of resistive devices 202 which represent positive and negative weights for each RPU cell 110 reduces the effect of a given one of the resistive devices 202 being formed as an OF device (+1 or −1) during formation of the RRAM devices.

Figure 3A:
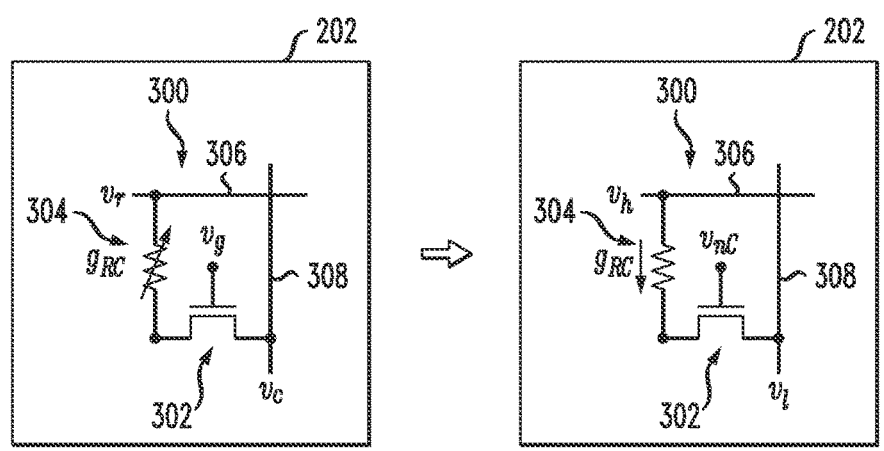
FIG. 3A is a schematic diagram illustrating an example resistive device of the RPU cell of FIG. 2 and a read of the resistive device, according to an embodiment of the invention.
Figure 3B:
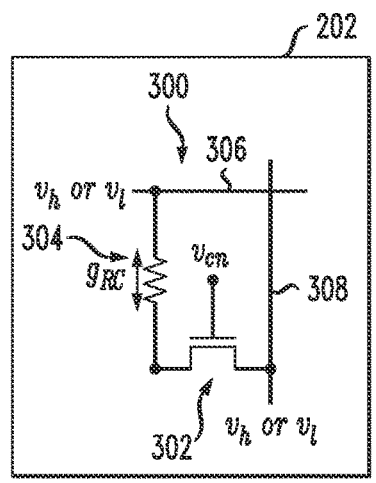
FIG. 3B is a schematic diagram illustrating the resistive device of FIG. 3A during a setting of the resistive device.
Figure 3C:
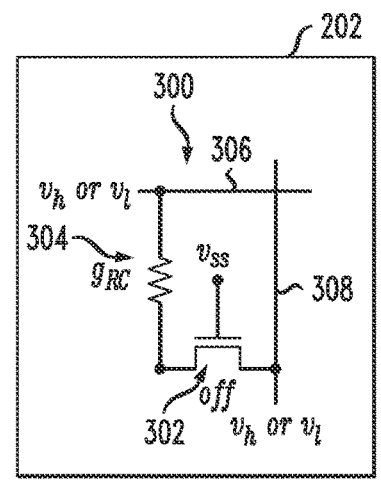
FIG. 3C is a schematic diagram illustrating the resistive device of FIG. 3A when the resistive device is not enabled.

With reference now to FIGS. 3A-3C, in some embodiments, one or more of the resistive devices 202 may comprise a one-transistor and one-resistor (1T1R) cell 300. A 1T1R cell 300 is a structure that limits the current that flows through a compliance transistor 302. The left side of FIG. 3A illustrates a configuration of the 1T1R cell 300. As seen on the left side of FIG. 3A, a row control line 306 is configured to supply a row voltage $v_r$ to the 1T1R cell 300 and is electrically connected to row control line 106 (FIG. 1). A column control line 308 is configured to supply a column voltage $v_c$ to the 1T1R cell 300 and is electrically connected to column control line 108 (FIG. 1). In some embodiments, a gate voltage $v_g$ may also be supplied to the compliance transistor 302 to bias the compliance transistor 302. In some embodiments, the compliance transistor 302 comprises an n-channel metal-oxide semiconductor (NMOS) transistor. In some embodiments, the compliance transistor 302 comprises a p-channel metal-oxide semiconductor (PMOS) transistor. A variable resistor 304 is electrically disposed between the row control line 306 and the compliance transistor 302 and has a variable resistance $g_{RC}$.

The right side of FIG. 3A illustrates a read of the weight or a forward propagation. During the read or forward propagation, as can be seen on the right side of FIG. 3A, row control line 306 is supplied with an arbitrary bias $v_h$ and column control line 308 is set to ground $v_l$, e.g., 0 volts (V). The compliance transistor 302 is supplied with a compliance gate bias $v_{nC}$ which limits the current through the compliance transistor 302 such that the state of the variable resistor 304 may be read without alteration. The compliance gate bias $v_{nC}$ has a value which is small enough that the maximum conductance in the 1T1R cell 300 is limited by the transistor. For example, in a linear operation regime of the compliance transistor 302, the conductance is proportional to the gate bias $v_g$, in this case compliance gate bias $v_{nC}$. If the compliance gate bias $v_{nC}$ has a value that is small enough to match the target maximum conductance of the 1T1R cell 300, the compliance transistor 302 will act as a current limiting element and inhibit an excessive amount of current from flowing. As can be seen on the right side of FIG. 3A, current flows through the 1T1R cell 300 from the row control line 306 to the column control line 308 to read the weight or perform forward propagation on the 1T1R cell 300.

With reference to FIG. 3B, during a setting of the weight of the variable resistor 304, row control line 306 is set to one of the arbitrary bias $v_h$ and the ground $v_l$ and column control line 308 is set to the other of the arbitrary bias $v_h$ and the ground $v_l$. The compliance transistor 302 is supplied with the gate control bias $v_{cn}$, which is configured to inhibit an excessive current flow through the compliance transistor 302, but allows sufficient current flow through the compliance transistor 302 (e.g. 100 uA) to change the state of the variable resistor 304. As can be seen in FIG. 3B, the current flows through the 1T1R cell 300 from the column control line 308 to the row control line 306. This resets the value of the variable resistor 304 of the 1T1R cell 300. In some embodiments, for example, a reset may comprise setting the variable resistor 304 to a high resistance state. In some embodiments, a reset may alternatively set the variable resistor 304 to a low resistance state or any to any other state that is designated as a reset state.

With reference to FIG. 3C, when the 1T1R cell 300 is not selected for the operation, e.g., disabled, the gate bias $v_g$ of the compliance transistor 302 is set to a bias $v_{ss}$, also referred to as logical low, e.g., 0V, and the flow of current through the variable resistor 304 is inhibited so as to not change the value of the variable resistor 304. In some embodiments, $v_{ss}$ is equal to $v_l$. In some embodiments, $v_{ss} < v_{nC} < v_{cn}$. As seen in FIG. 3C, similar to during the setting of the weight, row control line 306 is set to one of the arbitrary bias $v_h$ and the ground $v_l$ and column control line 308 is set to the other of the arbitrary bias $v_h$ and the ground $v_l$.

With reference now to FIGS. 4A-4D, in some embodiments, one or more of the resistive devices 202 may comprise a two-transistor and one-resistor (2T1R) cell 400. The above described 1T1R cell 300 is configured to accommodate at least three different transistor gate biases $v_{cn}, v_{nC}, v_l$ which requires additional circuit complexity. The need for such additional circuit complexity may be reduced or avoided by utilizing the 2T1R cell 400 structure. For example, one of the transistors in the 2T1R cell 400 may be assigned for read/write current compliance while the other transistor may be assigned to control the enabling or disabling of the cell. A row control line 406 is configured to supply a row voltage $v_r$ to the 2T1R cell 400 and is electrically connected to row control line 106 (FIG. 1), in a similar manner to row control line 306 (FIGS. 3A-3C). A column control line 408 is configured to supply a column voltage $v_c$ to the 2T1R cell 400 and is electrically connected to column control line 108 (FIG. 1), in a similar manner to column control line 308 (FIGS. 3A-3C).

2T1R cell 400 also comprises a compliance transistor 402, similar to compliance transistor 302 (FIGS. 3A-3C) and a logic transistor 403 electrically disposed between the compliance transistor 402 and the column control line 408. In some embodiments, gate voltages $v_g$ may also be supplied to both the compliance transistor 402 and the logic transistor 403 to bias the compliance transistor 402 and the logic transistor 403. In some embodiments, the compliance transistor 402 comprises an NMOS transistor. In some embodiments, the logic transistor 403 also comprises an NMOS transistor. In some embodiments, compliance transistor 402 and logic transistor 403 may both comprise PMOS transistors. In some embodiments, one of compliance transistor 402 and logic transistor 403 may comprise an NMOS transistor while the other of compliance transistor 402 and logic transistor 403 may comprise a PMOS transistor. A variable resistor 404 is electrically disposed between the row control line 406 and the compliance transistor 402 and has a variable resistance $g_{RC}$.

Figure 4A:
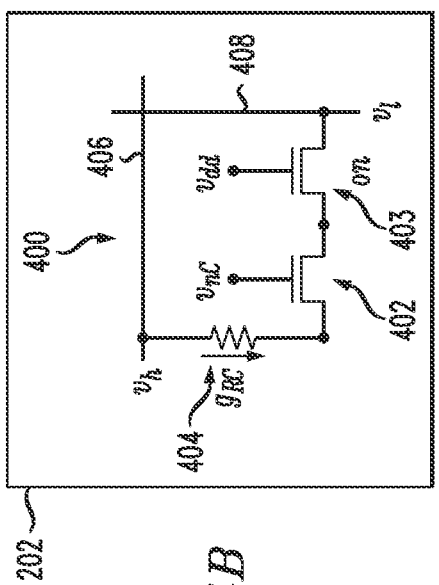
FIG. 4A is a schematic diagram illustrating an example resistive device of the RPU cell of FIG. 2, according to another embodiment of the invention.
Figure 4B:
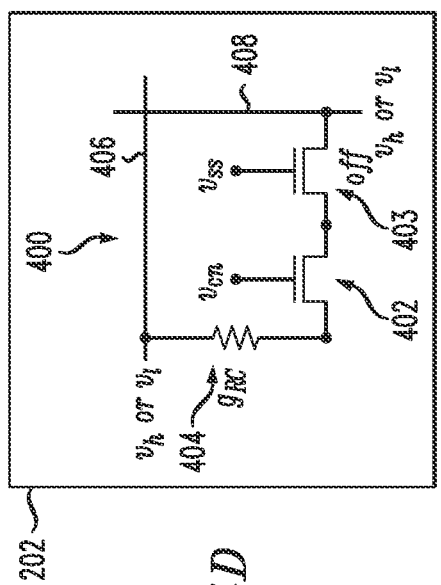
FIG. 4B is a schematic diagram illustrating the resistive device of FIG. 4A during a read of the resistive device.

With reference to FIG. 4B, during a read of the weight or a forward propagation, row control line 406 is supplied with an arbitrary bias $v_h$ and column control line 408 is set to ground $v_l$, e.g., 0V. The compliance transistor 402 is supplied with the compliance gate bias $v_{nC}$ which limits the current through the compliance transistor 402, as described above. The logic transistor 403 is supplied with a logic gate bias $v_{dd}$, also referred to as logical high, e.g., a fixed value for the technology such as 1.2V, to enable the logic transistor 403. As can be seen in FIG. 4B, current flows through the 2T1R cell 400 from the row control line 406 to the column control line 408 via compliance transistor 402 and logic transistor 403 to read the weight or forward propagate the 2T1R cell 400. In some embodiments, $v_{ss} < v_{nC} < v_{cn} < v_{dd}$.

Figure 4C:
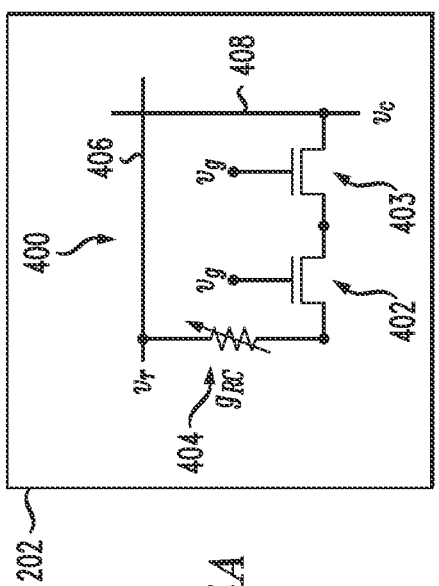
FIG. 4C is a schematic diagram illustrating the resistive device of FIG. 4A during a setting of the resistive device.

With reference to FIG. 4C, during a setting or resetting of the weight, row control line 406 is set to one of the arbitrary bias $v_h$ and the ground $v_l$ and column control line 408 is set to the other of the arbitrary bias $v_h$ and the ground $v_l$. In some cases, the varying resistance of the variable resistor 404 may require that information be written in both polarities. In such a case, the setting of the row control line 406 and column control line 408 are switched, e.g., row control line 406 is set to the other of the arbitrary bias $v_h$ and the ground $v_l$ and the column control line 408 is subsequently set to the one of the arbitrary bias $v_h$ and the ground $v_l$ for an opposite polarity writing. The compliance transistor 402 is set to the gate control bias $v_{cn}$ and the logic transistor 403 is set to the logic gate bias $v_{dd}$. As can be seen in FIG. 4C, current flows through the 2T1R cell 400 from the column control line 408 to the row control line 406 to set or reset the 2T1R cell 400.

Figure 4D:
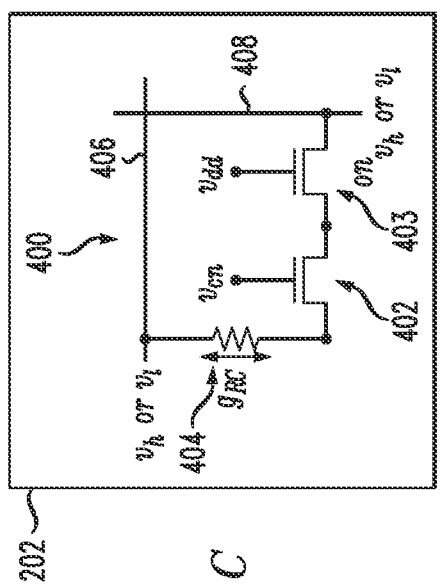
FIG. 4D is a schematic diagram illustrating the resistive device of FIG. 4A when the resistive device is not enabled.

With reference to FIG. 4D, when the 2T1R cell 400 is not enabled, the logic transistor 403 is set to have a gate bias $v_{ss}$ (e.g., 0V) and the current is inhibited from flowing through the 2T1R cell 400. As seen in FIG. 4D, similar to during the setting or resetting of the weight, row control line 406 is set to one of the arbitrary bias $v_h$ and the ground $v_l$ and column control line 408 is set to the other of the arbitrary bias $v_h$ and the ground $v_l$.

With reference now to FIGS. 5A-5D, in some embodiments, one or more of the resistive devices 202 may comprise a 2T1R cell 500. A 2T1R cell 500 is a structure that incorporates different polarities for better current compliance capability which provides a stable writing operation for a variable resistor 504. A row control line 506 is configured to supply a row voltage $v_r$ to the 2T1R cell 500 and is electrically connected to row control line 106 (FIG. 1), in a similar manner to row control line 306 (FIGS. 3A-3C). A column control line 508 is configured to supply a column voltage $v_c$ to the 2T1R cell 500 and is electrically connected to column control line 108 (FIG. 1), in a similar manner to column control line 308 (FIGS. 3A-3C).

2T1R cell 500 also comprises a pair of compliance transistors 502-1 and 502-2 electrically disposed in parallel between the row control line 506 and the column control line 508. In some embodiments, gate voltages $v_g$ may also be supplied to both of the compliance transistors 502-1 and 502-2 to bias the compliance transistors 502-1 and 502-2. In some embodiments, the compliance transistor 502-1 comprises an NMOS transistor and the compliance transistor 502-2 comprises a PMOS transistor. In other embodiments, the compliance transistor 502-1 may alternatively comprise a PMOS transistor and the compliance transistor 502-2 may alternatively comprise an NMOS transistor. A variable resistor 504 is disposed between the row control line 506 and the compliance transistors 502-1 and 502-2 and has a variable resistance $g_{RC}$.

Figure 5A:
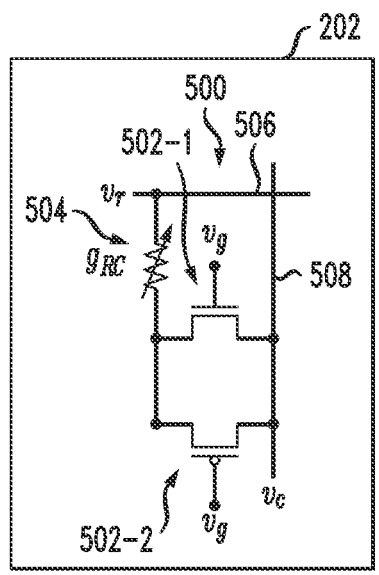
FIG. 5A is a schematic diagram illustrating an example resistive device of the RPU cell of FIG. 2, according to yet another embodiment of the invention.
Figure 5B:
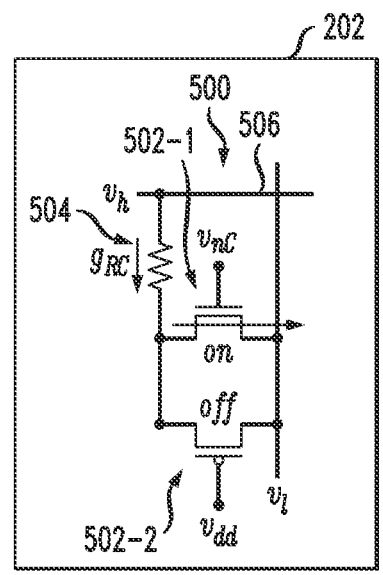
FIG. 5B is a schematic diagram illustrating the resistive device of FIG. 5A during a read of the resistive device.

With reference to FIG. 5B, during a read of the weight or a forward propagation, row control line 506 is supplied with an arbitrary bias $v_h$ and column control line 508 is set to ground $v_l$, e.g., 0V. The compliance transistor 502-1 is supplied with a compliance gate bias $v_{nC}$ which limits the current through the compliance transistor 502-1. The compliance transistor 502-2 is supplied with the arbitrary bias $v_h$ which turns off the compliance transistor 502-2. As can be seen in FIG. 5B, current flows through the 2T1R cell 500 from the row control line 506 to the column control line 508 via compliance transistor 502-1 to read or forward propagate the 2T1R cell 500.

Figure 5C:
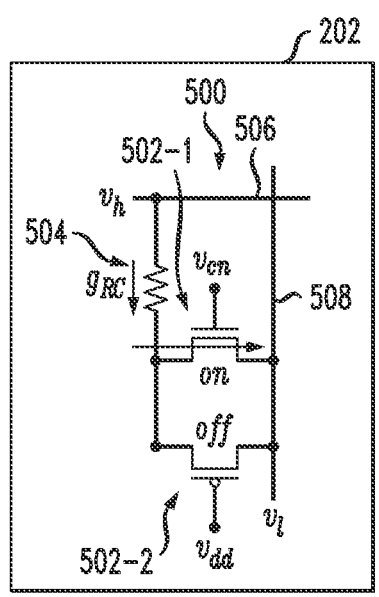
FIG. 5C is a schematic diagram illustrating the resistive device of FIG. 5A during a setting of the resistive device in a first polarity.

With reference to FIG. 5C, during a setting of the weight, e.g., a write, in a first polarity, also referred to as a regular polarity, row control line 506 is set to the arbitrary bias $v_h$ and column control line 508 is set to the ground $v_l$. This time, the compliance transistor 502-1 is supplied with the gate control bias $v_{cn}$ which turns on the compliance transistor 502-1 and the compliance transistor 502-2 is turned off with the gate bias $v_{dd}$. As can be seen in FIG. 5C, current flows through the 2T1R cell 500 from the column control line 508 to the row control line 506 via compliance transistor 502-2 to set the 2T1R cell 500.

During a setting of the weight, e.g., a write, in a second polarity that is a reverse of the first polarity, row control line 506 is set to the ground $v_l$ and column control line 508 is supplied with the arbitrary bias $v_h$. This time, compliance transistor 502-1 is supplied with the bias $v_{ss}$, which turns off the compliance transistor 502-1 and the compliance transistor 502-2 is turned on with a gate control bias of $v_{cp}$. Gate bias of $v_{cp}$ is similar to $v_{cn}$ but for PMOS transistors instead of NMOS transistors. In some embodiments, $v_{ss} < v_{cp} < v_{dd}$. In this case current flows through the 2T1R cell 500 from the column control line 508 to the row control line 506 via the compliance transistor 502-2 to set the 2T1R cell 500 in the reverse polarity.

Figure 5D:
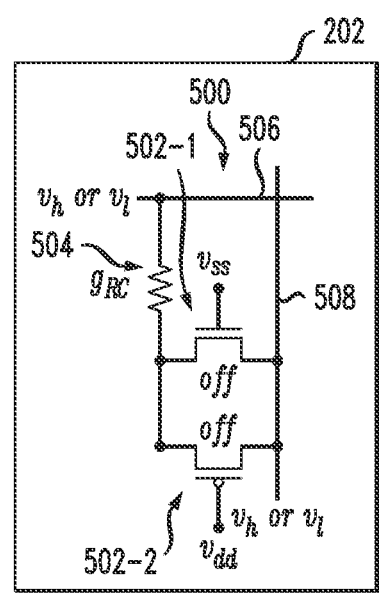
FIG. 5D is a schematic diagram illustrating the resistive device of FIG. 5A when the resistive device is not enabled.

With reference now to FIG. 5D, when the 2T1R cell 500 is not enabled, the compliance transistor 502-1 is set to have the gate bias $v_{ss}$ (e.g., 0V) which turns off the compliance transistor 502-1 and compliance transistor 502-2 is set to have the gate bias $v_{dd}$ which turns off the compliance transistor 502-2. As a result, the current is inhibited from flowing through the variable resistor 504 of the 2T1R cell 500. As seen in FIG. 5D, when the 2T1R cell 500 is not enabled, row control line 506 is set to one of the arbitrary bias $v_h$ and the ground $v_l$ and column control line 508 is set to the other of the arbitrary bias $v_h$ and the ground $v_l$.

With reference now to FIGS. 6A-6D, in some embodiments, one or more of the resistive devices 202 may comprise a four-transistor and one-resistor (4T1R) cell 600. A 4T1R cell 600 is a structure that reduces the need for extra complexity in the peripheral circuitry that would be needed for 2T1R cell 400 (FIGS. 4A-4D) and improves writing control for different polarities as with 2T1R cell 500 (FIGS. 5A-5D). In addition, the capability to read and write in both regular and reverse polarities allows for more flexibility in the architecture design of the neuromorphic device architecture 100. A row control line 606 is configured to supply a row voltage $v_r$ to the 4T1R cell 600 and is electrically connected to row control line 106 (FIG. 1), in a similar manner to row control line 306 (FIGS. 3A-3C). A column control line 608 is configured to supply a column voltage $v_c$ to the 4T1R cell 600 and is electrically connected to column control line 108 (FIG. 1), in a similar manner to column control line 308 (FIGS. 3A-3C).

Figure 6A:
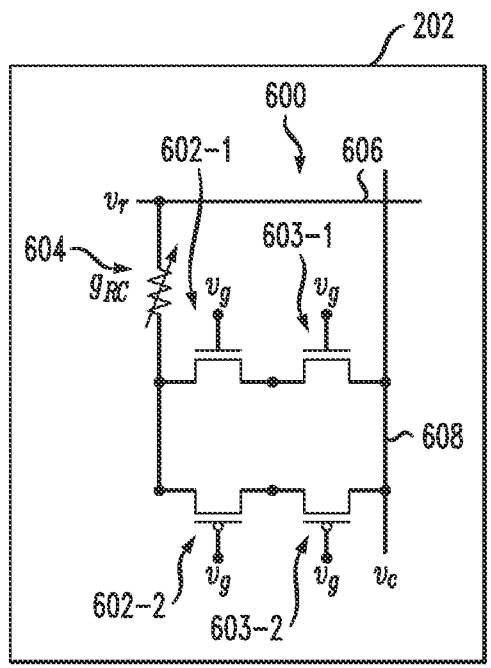
FIG. 6A is a schematic diagram illustrating an example resistive device of the RPU cell of FIG. 2, according to an additional embodiment of the invention.

4T1R cell 600 also comprises a pair of compliance transistors 602-1 and 602-2 electrically disposed in parallel between the row control line 606 and the column control line 608. 4T1R cell 600 comprises a pair of logic transistors 603-1 and 603-2 electrically disposed between the compliance transistors 602-1 and 602-2 and the column control line 608. As seen in FIG. 6A, logic transistor 603-1 is electrically disposed in serial between compliance transistor 602-1 and column control line 608 while logic transistor 603-2 is electrically disposed in serial between compliance transistor 602-2 and column control line 608. In some embodiments, gate voltages $v_g$ may also be supplied to the compliance transistors 602-1 and 602-2 and the logic transistors 603-1 and 603-2 to bias the compliance transistors 602-1 and 602-2 and the logic transistors 603-1 and 603-2. In some embodiments, the compliance transistor 602-1 and logic transistor 603-1 comprise NMOS transistors and compliance transistor 602-2 and logic transistor 603-2 comprise PMOS transistors. In some embodiments, the compliance transistor 602-1 and logic transistor 603-1 comprise PMOS transistors and compliance transistor 602-2 and logic transistor 603-2 comprise NMOS transistors. A variable resistor 604 is electrically disposed between the row control line 606 and the compliance transistors 602-1 and 602-2 and has a variable resistance $g_{RC}$.

Figure 6B:
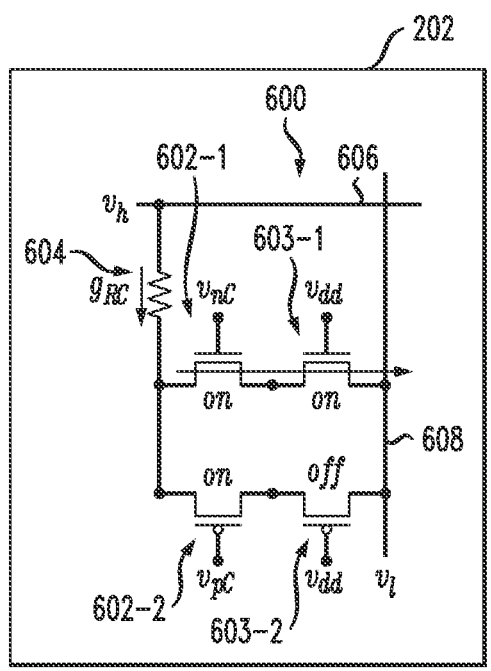
FIG. 6B is a schematic diagram illustrating the resistive device of FIG. 6A during a read of the resistive device in a first polarity.

With reference to FIG. 6B, during a read of the weight or a forward propagation in a first polarity, also referred to as a regular polarity, row control line 606 is supplied with an arbitrary bias $v_h$ and column control line 608 is set to ground $v_l$, e.g., 0V. The compliance transistor 602-1 is supplied with a compliance gate bias $v_{nC}$ which limits the current through the compliance transistor 602-1. The compliance transistor 602-2 is supplied with a compliance gate bias $v_{pC}$ which limits the current through the compliance transistor 602-2 in a similar manner to compliance gate bias $v_{nC}$. The logic transistor 603-1 is supplied with a logic gate bias $v_{dd}$ to turn on the logic transistor 603-1 and the logic transistor 603-2 is supplied with a logic gate bias $v_{dd}$ to turn off the logic transistor 603-2. As can be seen in FIG. 6B, current flows through the 4T1R cell 600 from the row control line 606 to the column control line 608 via compliance transistor 602-1 and logic transistor 603-1 to read or forward propagate the 4T1R cell 600.

During a read of the weight or a forward propagation in a second polarity that is opposite to the first polarity of FIG. 6B, e.g., referred to herein as the reverse polarity, row control line 606 is set to the ground $v_l$ and column control line 608 is supplied with the arbitrary bias $v_h$. The compliance transistor 602-1 is supplied with the compliance gate bias $v_{nc}$ which limits the current through the compliance transistor 602-1. The compliance transistor 602-2 is supplied with the compliance control bias $v_{pc}$ which limits the current through the compliance transistor 602-2. The logic transistor 603-1 is supplied with a logic gate bias $v_{ss}$ to turn off the logic transistor 603-1 and the logic transistor 603-2 is supplied with a logic gate bias $v_{ss}$ to turn on the logic transistor 603-2. In this case, the current flows through the 4T1R cell 600 from the column control line 608 to the row control line 606 via the compliance transistor 602-2 and logic transistor 603-2 to read or backward propagate the 4T1R cell 600 in the reverse polarity.

Figure 6C:
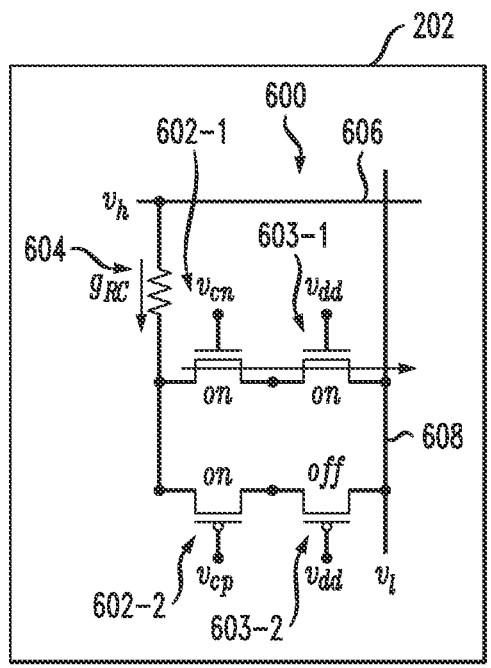
FIG. 6C is a schematic diagram illustrating the resistive device of FIG. 6A during a setting of the resistive device in the first polarity.

With reference to FIG. 6C, during a setting of the weight, e.g., a write, for the first polarity, row control line 606 is supplied with the arbitrary bias $v_h$ and column control line 608 is set to ground $v_l$, e.g., 0V. The compliance transistor 602-1 is supplied with a gate control bias $v_{cn}$ which turns on the compliance transistor 602-1. The compliance transistor 602-2 is supplied with the gate control bias $v_{cp}$ which turns on the compliance transistor 602-2. The logic transistor 603-1 is supplied with a logic gate bias $v_{dd}$ to turn on the logic transistor 603-1 for the regular polarity and the logic transistor 603-2 is supplied with a logic gate bias $v_{dd}$ to turn off the logic transistor 603-2 for the regular polarity. As can be seen in FIG. 6C, current flows through the 4T1R cell 600 from the row control line 606 to the column control line 608 via compliance transistor 602-1 and logic transistor 603-1 to set the weight of the variable resistor 604 of the 4T1R cell 600.

During a setting of the weight, e.g., a write, for the second polarity, also referred to as the reverse polarity, row control line 606 is set to ground $v_l$, e.g., 0V, and column control line 608 is supplied with an arbitrary bias $v_h$. The compliance transistor 602-1 is supplied with a gate control bias $v_{cn}$ which turns on the compliance transistor 602-1. The compliance transistor 602-2 is supplied with the gate control bias $v_{cp}$ which turns on the compliance transistor 602-2. The logic transistor 603-1 is supplied with a logic gate bias $v_{ss}$ to turn off the logic transistor 603-1 for the reverse polarity and the logic transistor 603-2 is supplied with a logic gate bias $v_{ss}$ to turn on the logic transistor 603-2 for the reverse polarity. In this case, the current flows through the 4T1R cell 600 from the column control line 608 to the row control line 606 via logic transistor 603-2 and compliance transistor 602-2 to set the weight of the variable resistor 604 of the 4T1R cell 600. This setting of the weight in the reverse polarity may also be referred to as a reset.

Figure 6D:
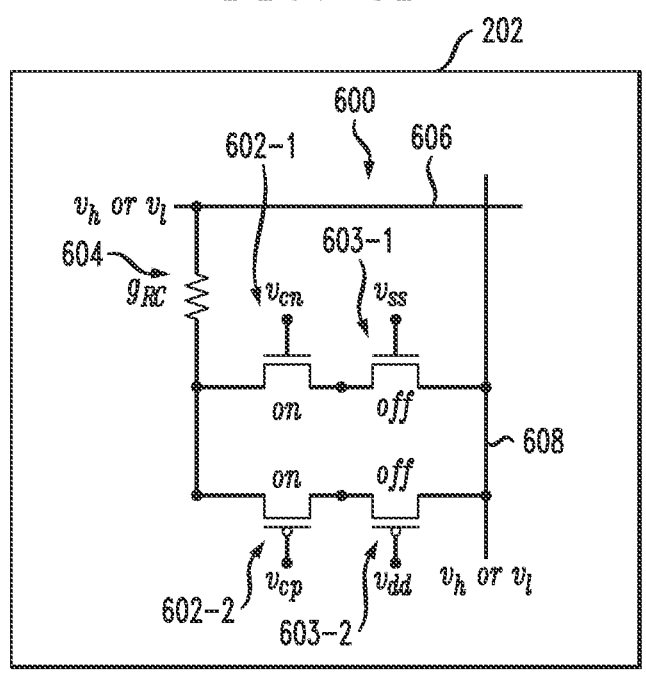
FIG. 6D is a schematic diagram illustrating the resistive device of FIG. 6A when the resistive device is not enabled.

With reference now to FIG. 6D, when the 4T1R cell 600 is not enabled, the compliance transistor 602-1 is supplied with a gate control bias $v_{cn}$ which turns on the compliance transistor 602-1. The compliance transistor 602-2 is supplied with the gate control bias $v_{cp}$ which turns on the compliance transistor 602-2. The logic transistor 603-1 is supplied with a logic gate bias $v_{ss}$ to turn off the logic transistor 603-1 and the logic transistor 603-2 is supplied with a logic gate bias $v_{dd}$ to turn off the logic transistor 603-2. As also seen in FIG. 6D, when the 4T1R cell 600 is not enabled, row control line 606 is set to one of the arbitrary bias $v_h$ and the ground $v_l$ and column control line 608 is set to the other of the arbitrary bias $v_h$ and the ground $v_l$. As a result, the current is inhibited from flowing through the variable resistor 604 of the 4T1R cell 600.

In illustrative embodiments any combination of 1T1R cell 300, 2T1R cell 400, 2T1R cell 500 and 4T1R cell 600 may be used as resistive devices 202 for RPU cells 110. For example, in some embodiments, RPU cells 110 may comprise only one kind of resistive device 202, e.g., only 1T1R cells 300, two kinds of resistive devices, e.g., a combination of 1T1R cells 300 and 2T1R cells 400, or any other combination. In some embodiments, resistive devices 202 may comprise any other kinds or configurations of cells. For example, resistive devices 202 may comprise 2T2R cells, 4T2R cells, or any other kinds of resistive devices 202.

In illustrative embodiments, for example, the use of 1T1R cells may limit the maximum current of OF devices (devices that have a forming failure which result in +1 or −1 values) which sets an upper bound on the device conductance.

While neuromorphic device architecture 100 is described above with respect to performing one or more machine learning operations such as, e.g., forward propagation and backward propagation, in some embodiments, neuromorphic device architecture 100 may alternatively be utilized as an inference only device on which an already trained machine learning or DNN inference model is loaded for execution and implementation.

In illustrative embodiments, the effect of forming failures in RRAM or other resistive devices 202 on the execution of an inference model may be further reduced through the use of an inference model training process that takes into account such forming failures.

For example, with reference now to FIG. 7, an example inference model training process that is configured to reduce the effect of formation failures comprises steps 700 through 712. The inference model training process may be performed by a hardware processing device such as, e.g., a CPU, GPU, or other similar processing device.

At 700, an image input for the inference training process is loaded. The image input may comprise, for example, the configuration of the inference model, a weight matrix for the inference model, initialization values for the weight matrix, training data, or other similar inputs for training the inference model.

At 702, forward propagation is performed on the inference model based on the image input. For example, the forward propagation may be performed using any conventional machine learning forward propagation techniques.

At 704, a loss calculation is performed on the outcome of the forward propagation. For example, the loss calculation may be performed using any conventional machine learning loss calculation techniques.

At 706, a backward propagation is performed on the inference model based at least in part on the loss calculation. For example, the backward propagation may be performed using any conventional machine learning backward propagation techniques.

At 708, the output of the backward propagation is fed into the weight matrix of the inference model.

At 710, each weight in the weight matrix is quantized, for example, using any conventional machine learning quantization technique.

At 712, a random defect is determined and added to each quantized weight. In some embodiments, the random defect may comprise a 0, a +1 or a −1. In some embodiments, the random defect may comprise any other value. The addition of a random defect is configured to mimic the potential formation failures that may be found on the resistive devices of the neuromorphic device architecture 100. These quantized weights with defects are stored as a duplicate weight matrix with defects. With the addition of random defects to the quantized weights, the process returns to step 702. The defect adjusted weights found in the duplicate weight matrix are then used for both forward propagation at step 702 and backward propagation at step 706 with the output being used to update the original weight matrix again at 708.

An illustrative process for adding a defect to the weights will now be described in more detail with reference to FIG. 8. The process of FIG. 8 comprises steps 800 through 820.

At 800, the probabilities $p_{+1}$, $p_{-1}$ and $p_0$ for each type of random defect are obtained, for example, from memory of a computing device. In some embodiments, for example, the probabilities may be generated based on the particular technology being utilized via sampling, measurement, statistics or in other similar manners. As an example, the number of resistive devices in a given sample that are stuck in a low resistance state may be utilized to determine the probabilities $p_{+1}$, $p_{-1}$ while the number of resistive devices in the given sample that are stuck in a high resistance state may be utilized to determine the probability $p_0$. $p_{+1}$ is the probability of having a +1 defect, $p_{-1}$ is the probability of having a −1 defect and $p_0$ is the probability of having a 0 defect. For example, the probabilities $p_{+1}$ and $p_{-1}$ are the probabilities of cells whose resistance values are stuck at low resistance value. In such case, a large amount of current always flows and the weight value becomes stuck at the maximum which may be detected by the peripheral circuitry. If such failure occurs at $202_{w+}$, it is considered a +1 defect.

If such failure occurs at $202_{w-}$, it is considered a −1 defect. The probability of occurrence of such cases are $p_{+1}$ and $p_{-1}$ respectively.

$p_0$ is the probability of cells where the cell resistance values are stuck at a high resistance value. In such a case, only a minimal current flows through the cell and the weight value becomes minimal, e.g., approximately 0, which may be detected by the peripheral circuitry. The probability of such a case occurring is $p_0$.

At 802, a total probability $p_{tot}$ is determined as a sum of the probabilities according to equation (1) below:

$$p_{tot} = p_{+1} + p_{-1} + p_0 \qquad (1)$$

At 804, an initial weight $w_i$ is selected for the addition of a defect where $i \in [1, N_{tot}]$. For example, the first weight $w_1$ may be selected.

At 806, a random number n is generated where $n \in [0,1]$. For example, the random number may be generated using any random number generator. If the random number n is less than or equal to the total probability $p_{tot}$, the process proceeds to step 808. If the random number n is greater than the total probability $p_{tot}$, the process proceeds to step 812.

At step 808, a random number m is generated where $m \in [0,1]$. If the random number m is less than or equal to the probability $p_0$ divided by the total probability $p_{tot}$, the process proceeds to step 810. If the random number m is greater than the probability $p_0$ divided by the total probability $p_{tot}$, the process proceeds to step 814.

At 810, the weight element $w_i$ is set to 0 and the process proceeds to step 812.

At 814, a random number q is generated where $q \in [0,1]$. If the random number q is less than or equal to the probability $p_{+1}$ divided by the sum of the probability $p_{+1}$ and the probability the process proceeds to step 816. If the random number q is greater than the probability $p_{+1}$ divided by the sum of the probability $p_{+1}$ and the probability the process proceeds to step 818.

At 816, the weight element $w_i$ is set to +1 and the process proceeds to step 812.

At 818, the weight element $w_i$ is set to −1 and the process proceeds to step 812.

At 812, the next weight element $w_i$ is selected, for example, by incrementing i by 1. If i is less than or equal to $N_{tot}$, the process returns to 806. If i is greater than $N_{tot}$, the process proceeds to step 820 and ends since defects have been determined and added for all of the weight elements.

The matrix of weight elements $w_i$ is then used to generate the duplicate weight matrix with defects, described above, which is used during forward and backward propagation to update the original weight matrix.

In this manner, defects may be added to the inference model during training to take into account formation failures associated with the resistive devices 202 of the neuromorphic device architecture 100.

Once the inference model has been generated and trained using these added defects, the inference model may be loaded onto the neuromorphic device architecture 100 and executed. The resulting inference model operations performed by the neuromorphic device architecture 100 will exhibit increased accuracy over conventional techniques that do not account for formation failures in the resistive devices 202 when training the neural network.

In some embodiments, the particular resistive devices 202 that have forming failures may be known. For example, a given resistive device 202 may be known to comprise an FF device, an OF device with a +1 defect, or an OF device with a −1 defect. In the case where such forming failure information is available about particular resistive devices 202, the addition of defects into the weight matrix may be adjusted. For example, for the weights that correspond to resistive devices 202 known to have particular forming failures, those weights may receive an added defect that is targeted specifically for that type of forming failure. For example, if it is known that there are forming failures for the resistive devices 202 associated with weights $w_1=w_{27}=w_{45}=0$, the 0 added defect may be applied to the weights for those resistive devices 202. Likewise, if it is known that there are forming failures for the resistive devices 202 associated with weights $w_6=w_{71}=+1$, the +1 added defect may be applied to the weights for those resistive devices 202.

In some cases, for example, where the resistive devices associated with only one type of forming failure are known, the weights associated with those resistive devices may be updated with the correct added defect while the weights associated with the remaining resistive devices may receive randomly generated added defects as described above.

The above disclosed techniques generate an inference model that is more resilient to both FF and OF forming failures in resistive devices of a neuromorphic device architecture as compared with conventional techniques thereby increasing the accuracy of the inference model when executed on the neuromorphic device architecture. In addition, even in cases where the resistive devices do not comprise FF or OF devices, but instead comprise a non-ideal deviation from a desired formation that is within tolerable limits, the accuracy of the inference model may still be improved by the use of the above disclosed techniques since the randomly introduced defects also reduce the impact of these non-ideal deviations.

The present invention may be a system, a method, and/or a computer program product at any possible technical detail level of integration. The computer program product may include a computer readable storage medium (or media) having computer readable program instructions thereon for causing a processor to carry out embodiments of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform embodiments of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 9:
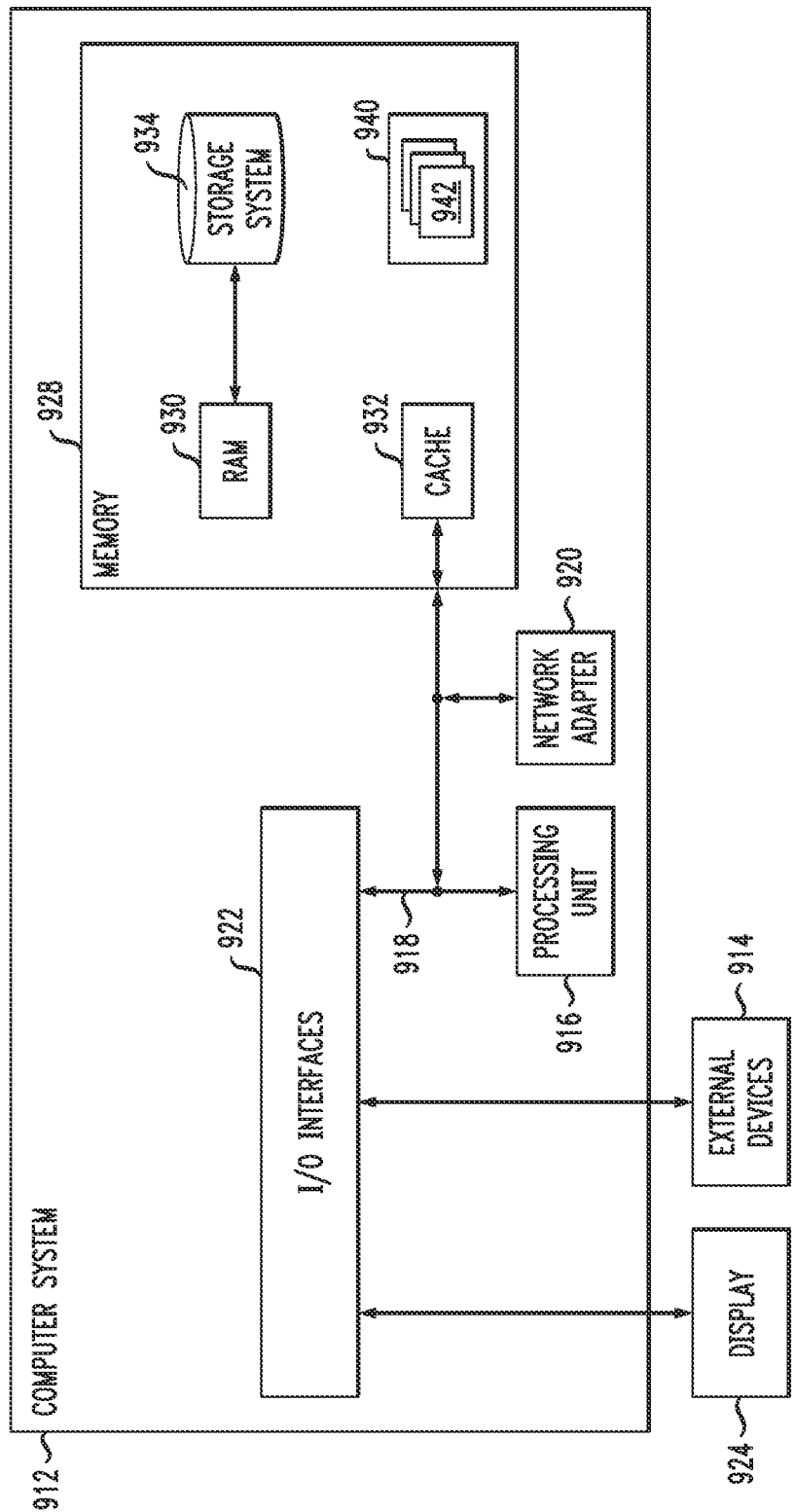
FIG. 9 depicts a computer system in accordance with which one or more components/steps of techniques of the invention may be implemented, according to an exemplary embodiment of the invention.

One or more embodiments can make use of software running on a general-purpose computer or workstation. With reference to FIG. 9, in a computing node 910 there is a computer system/server 912, which is operational with numerous other general purpose or special purpose computing system environments or configurations. Examples of well-known computing systems, environments, and/or configurations that may be suitable for use with computer system/server 912 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, mobile and wearable devices, and distributed cloud computing environments that include any of the above systems or devices, and the like.

Computer system/server 912 may be described in the general context of computer system executable instructions, such as program modules, being executed by a computer system. Generally, program modules may include routines, programs, objects, components, logic, data structures, and so on that perform particular tasks or implement particular abstract data types. Computer system/server 912 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 9, computer system/server 912 in computing node 910 is shown in the form of a general-purpose computing device. The components of computer system/server 912 may include, but are not limited to, one or more processors or processing units 916, a system memory 928, and a bus 918 that couples various system components including system memory 928 to processing unit 916. In an illustrative embodiment, processing unit 916 comprises FPU 102. In other embodiments, processing unit 916 may be separate from FPU 102 and configured to communicate with FPU 102 via bus 918 or a network adapter 920.

The bus 918 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

The computer system/server 912 typically includes a variety of computer system readable media. Such media may be any available media that is accessible by computer system/server 912, and it includes both volatile and non-volatile media, removable and non-removable media.

The system memory 928 can include computer system readable media in the form of volatile memory, such as random access memory (RAM) 930 and/or cache memory 932. The computer system/server 912 may further include other removable/non-removable, volatile/nonvolatile computer system storage media. By way of example only, storage system 934 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to the bus 918 by one or more data media interfaces. As depicted and described herein, the memory 928 may include at least one program product having a set (e.g., at least one) of program modules that are configured to carry out the functions of embodiments of the invention. A program/utility 940, having a set (at least one) of program modules 942, may be stored in memory 928 by way of example, and not limitation, as well as an operating system, one or more application programs, other program modules, and program data. Each of the operating system, one or more application programs, other program modules, and program data or some combination thereof, may include an implementation of a networking environment. Program modules 942 generally carry out the functions and/or methodologies of embodiments of the invention as described herein.

Computer system/server 912 may also communicate with one or more external devices 914 such as a keyboard, a pointing device, a display 924, etc., one or more devices that enable a user to interact with computer system/server 912, and/or any devices (e.g., network card, modem, etc.) that enable computer system/server 912 to communicate with one or more other computing devices. Such communication can occur via I/O interfaces 922. Still yet, computer system/server 912 can communicate with one or more networks such as a LAN, a general WAN, and/or a public network (e.g., the Internet) via network adapter 920. As depicted, network adapter 920 communicates with the other components of computer system/server 912 via bus 918. It should be understood that although not shown, other hardware and/or software components could be used in conjunction with computer system/server 912. Examples include, but are not limited to, microcode, device drivers, redundant processing units, external disk drive arrays, RAID systems, tape drives, and data archival storage systems, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A neuromorphic device, comprising:
a plurality of first control lines;
a plurality of second control lines; and
a matrix of resistive processing unit cells, each resistive processing unit cell being electrically connected with one of the first control lines and one of the second control lines, a given resistive processing unit cell comprising a first resistive device and a second resistive device, the first resistive device corresponding to a positive weight of the given resistive processing unit cell and the second resistive device corresponding to a negative weight of the given resistive processing unit cell;
wherein the matrix of resistive processing unit cells comprises an inference model, the inference model being trained to include weight values for the positive and negative weights of the given resistive processing unit cell that mitigate an effect of one or more of the first and second resistive devices of the given resistive processing unit cell exhibiting two or more different types of forming failures.

2. The neuromorphic device of claim 1, wherein the neuromorphic device comprises a two-dimensional crossbar array.

3. The neuromorphic device of claim 1, wherein the first and second resistive devices comprise resistive random-access memory devices.

4. The neuromorphic device of claim 1, wherein the first and second resistive devices comprise devices selected from the group consisting of one-transistor and one-resistor cells, two-transistor and one-resistor cells, four-transistor and one-resistor cells and two-transistor and two-resistor cells.

5. The neuromorphic device of claim 1, wherein the inference model is trained external to the neuromorphic device and loaded onto the matrix of resistive processing unit cells.

6. The neuromorphic device of claim 5, wherein the loaded inference model is trained to include weights having randomly generated defects that are configured to mitigate the effect of one or more of the first and second resistive devices of the given resistive processing unit cell that have forming failures.

7. The method of claim 1, wherein the two or more different types of forming failures comprise a forming failed resistive device defect and an over formed resistive device defect.

8. A method, comprising:
training an inference model, the training comprising:
obtaining a probability for a type of defect associated with a forming failure of a resistive device of a neuromorphic device; and
for a given weight in the inference model:
generating a random number;
determining based at least in part on the generated random number and the obtained probability for the type of defect that the type of defect should be added to the given weight; and
adding the type of defect to the given weight; and
loading the trained inference model onto the neuromorphic device, the neuromorphic device comprising a matrix of resistive processing unit cells, a given resistive processing unit cell comprising a first resistive device and a second resistive device, the first resistive device corresponding to a positive weight of the given resistive processing unit cell and the second resistive device corresponding to a negative weight of the given resistive processing unit cell; and
wherein loading the trained inference model onto the neuromorphic device comprises setting weight values of the positive and negative weights of the given resistive processing unit cell to mitigate an effect of one or more of the first and second resistive devices of the given resistive processing unit cell exhibiting two or more different types of forming failures.

9. The method of claim 8 further comprising executing the trained inference model on the neuromorphic device.

10. The method of claim 8, wherein the type of defect is selected from a group consisting of a 0 type of defect, a +1 type of defect and −1 type of defect, the 0 type of defect being associated with a forming failed resistive device and the +1 and −1 types of defects being associated with over formed resistive devices.

11. The method of claim 10, wherein obtaining the probability for the type of defect comprises obtaining probabilities for each of the 0 type of defect, +1 type of defect and −1 type of defect.

12. The method of claim 11, wherein training the inference model further comprises determining a sum of the obtained probabilities of the 0 type of defect, +1 type of defect and −1 type of defect.

13. The method of claim 12, wherein determining based at least in part on the generated random number and the obtained probability for the type of defect that the type of defect should be added to the given weight comprises comparing the generated random number to the determined sum of the obtained probabilities and determining based at least in part on the comparison of the generated random number to the determined sum of the obtained probabilities that the type of defect should be added to the given weight.

14. The method of claim 13, wherein determining based at least in part on the comparison of the generated random number to the determined sum of the obtained probabilities that the type of defect should be added to the given weight further comprises:
generating a second random number;
comparing the second random number to the probability of the 0 type defect divided by the sum of the obtained probabilities; and
determining, based at least in part on the comparison of the second random number to the probability of the 0 type defect divided by the sum of the obtained probabilities, that the type of defect should be added to the given weight.

15. The method of claim 14, wherein determining, based at least in part on the comparison of the second random number to the probability of the 0 type defect divided by the sum of the obtained probabilities, that the type of defect should be added to the given weight comprises:

generating a third random number;

comparing the third random number to the probability of the +1 type defect divided by a sum of the probability of the +1 type defect and the probability of the −1 type defect; and determining, based at least in part on the comparison of the third random number to the probability of the +1 type defect divided by a sum of the probability of the +1 type defect and the probability of the −1 type defect, that the type of defect should be added to the given weight.

16. The method of claim 8, wherein the training further comprises:

obtaining information indicating that at least one of the first and second resistive devices of the given resistive processing unit cell of the neuromorphic device comprises a forming failure;

identifying a corresponding weight in the inference model for the at least one resistive device that comprises the forming failure; and adding a type of defect associated with the forming failure of the at least one resistive device that comprises the forming failure to the identified corresponding weight.

17. A method comprising:

executing a trained inference model on a neuromorphic device, the neuromorphic device comprising a matrix of resistive processing unit cells, a given resistive processing unit cell comprising a first resistive device and a second resistive device, the first resistive device corresponding to a positive weight of the given resistive processing unit cell and the second resistive device corresponding to a negative weight of the given resistive processing unit cell, the trained inference model comprising a plurality of weight values corresponding to resistive devices of the resistive processing unit cells, wherein the weight values of the trained inference model mitigate an effect of one or more of the first and second resistive devices of the given resistive processing unit cell exhibiting two or more different types of forming failures.

18. The method of claim 17, wherein the two or more different types of forming failures are associated with randomly generated defects in the first and second resistive devices of the resistive processing unit cells, the randomly generated defects each comprising one of a 0 type defect, a +1 type defect and a −1 type defect, the 0 type of defect being associated with a forming failed resistive device and the +1 and −1 types of defects being associated with over formed resistive devices.

19. The method of claim 17, wherein a randomly generated defect for a given weight value is generated based at least in part on a probability of an occurrence of a formation failure of one of the first and second resistive devices of the given resistive processing unit cell corresponding to the given weight value.

20. The neuromorphic device of claim 1, wherein the given resistive processing unit cell comprises a resistor connected to said one of the first control lines and one or more transistors, at least one of the one or more transistors having a source/drain connected to said one of the second control lines, the resistor being configured in a series connection with the one or more transistors between said one of the first control lines and said one of the second control lines.

* * * * *